United States Patent [19]
Bhatt et al.

[11] Patent Number: 5,905,018
[45] Date of Patent: May 18, 1999

[54] METHOD OF PREPARING A SUBSTRATE SURFACE FOR CONFORMAL PLATING

[75] Inventors: Anilkumar Chinuprasad Bhatt, Johnson City; Ashwinkumar C. Bhatt, Endicott; Voya Rista Markovich, Endwell; William Earl Wilson, Waverly; Gerald Walter Jones, Apalachin, all of N.Y.

[73] Assignee: International Business Machines Corporation, Armonk, N.Y.

[21] Appl. No.: 08/957,275

[22] Filed: Oct. 24, 1997

Related U.S. Application Data

[62] Division of application No. 08/662,165, Jun. 12, 1996.
[51] Int. Cl.⁶ ........................................................ G03F 7/20
[52] U.S. Cl. ............................................. 430/315; 427/304
[58] Field of Search ..................................... 430/311, 313, 430/315, 324; 427/304

[56] References Cited

U.S. PATENT DOCUMENTS 5,158,860  10/1992  Gulla ........................................ 430/315

*Primary Examiner*—Kathleen Duda
*Attorney, Agent, or Firm*—Calfee, Halter & Griswold LLP

[57] ABSTRACT

Bridging between electrically conductive circuit features during conformal plating is prevented by avoiding the deposition of catalytic seed material onto non-circuit areas of the substrate. Preparatory to forming electrical circuit features on a nonconductive substrate by the full additive process, extraneous seed material is either trapped between two layers of a photoimageable film, whereby it is unavailable during plating, or deposited on the surface of an aqueous photoimageable film, which is removed prior to plating. The method embodying the present invention eliminates the need for seed removal after initial plating and prior to conformal plating of a precious metal over the initial plating.

11 Claims, 1 Drawing Sheet

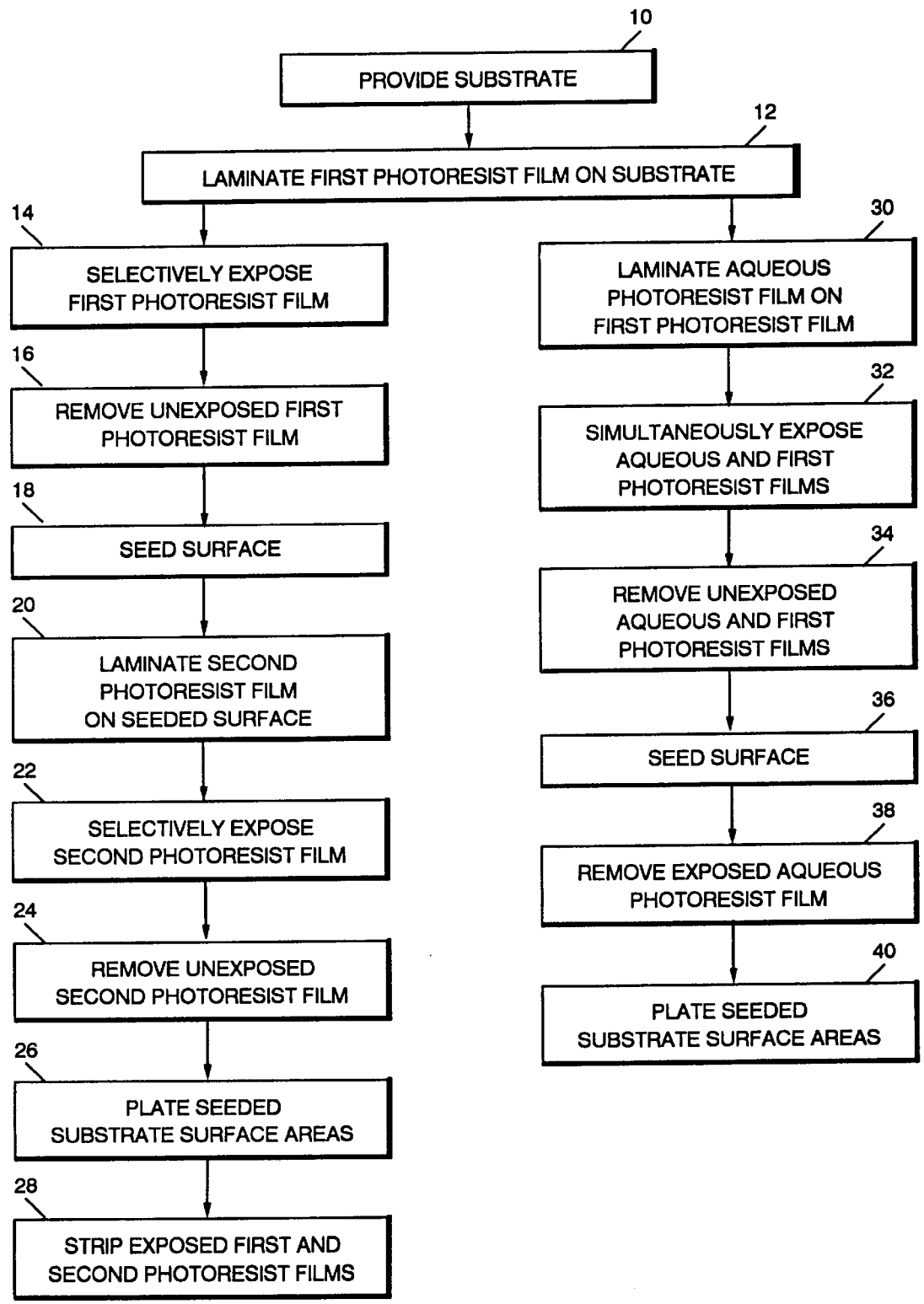

METHOD OF PREPARING A SUBSTRATE SURFACE FOR CONFORMAL PLATING

This application is a division of application Ser. No. 08/662,165 filed Jun. 12, 1996.

BACKGROUND OF THE INVENTION

1. Technical Field

This invention relates generally to a method for forming high density electrical circuit features on a nonconductive substrate surface, and more particularly to such a method that prevents catalytic seed material from being deposited on non-circuit surfaces of the substrate.

2. Background Art

A widely used method for forming finely defined electrical circuit features on a substrate includes seeding the surface of the substrate with a catalytic material that promotes the formation of conductive metal plating on desired portions of the substrate where individual leads and pads are defined. Those surfaces are then plated with an electrically conductive material such as copper to define the circuit features, followed by deposition of a thin precious metal coating on the copper base. This process is generally known as the fully additive process due to the additive formation of conductive circuit features directly on the nonconductive surface. A thin layer of precious metal is required to protect the copper from corrosion and improve surface wetability for subsequent solder connections. The thin precious metal plating process is generally referred to as conformal plating because the thin layer follows each surface contour of the underlying copper conductor. Typically, nickel is first deposited on the copper, and then gold deposited over the nickel, both preferably by electroless processes.

The fully additive process is often used to build the precise geometries found in large-scale integrated (LSI) components. Typically, the spaces between wire bond fingers may be as small as 2.5 mils or less. Desirably, all of the exposed copper elements of the circuit are plated with electroless nickel and gold, especially the wire bond pads. The fully additive process, which forms the copper circuit features directly onto a substrate surface, relies on having a palladium seed deposited on the surface to be plated, which promotes the formation of copper on that particular surface. If the palladium seed is not removed prior to the nickel/gold plating over the copper, gold will deposit on the substrate and form shorts between the conductive features of the electrical circuit. It is very difficult to remove the palladium seed layer from between the narrow spaces separating the circuit features. A galvanic cell is formed between the palladium seed and copper, which causes seed removal solutions, such as cyanide, to attack the copper in preference to the palladium.

The above problem becomes even worse if the component requires chemical hole cleaning (CHC). Thicker cross-sections, such as 2S2P (two signal, two power planes) and greater, require chemical hole cleaning to assure subsequent plating of the hole. Bridging of the circuit features by the subsequent deposition of nickel and gold is exacerbated by the CHC process, to the extent that there is presently no manufacturable conformal electroless precious metal plating process for CHC parts.

The present invention is directed to overcoming the problems set forth above. It is desirable to have a method of depositing palladium seeder material on the desired circuit feature portions of a substrate without requiring the removal of seed from the non-circuit areas of the substrate prior to conformal plating, as presently practiced. It is also desirable to have such a method that is economical, adaptable to high production processes, and provides a consistently high quality component ready for the conformal plating of precious metal on defined copper circuit features.

SUMMARY OF THE INVENTION

In accordance with one aspect of the present invention, a method for preparing a substrate surface for conformal plating includes providing a substrate having a surface adapted for formation of electrical circuit features thereon, laminating a first photoimageable film on the substrate surface, and exposing selected portions of the first photoimageable film whereby unexposed portions of the photoimageable film are disposed in a pattern defining predetermined electrical circuit features. The unexposed portion of the first photoimageable film is removed thereby revealing the substrate surface underlying the unexposed portions of the photoimageable film. The surface of the revealed substrate surface and the surface of the first photoimageable film is seeded with a catalyst selected to promote the formation of electrically conductive circuit features on the substrate. A second photoimageable film is laminated over the seeded surface of the first photoimageable film and the seeded surface of the substrate, thereby encapsulating the seed deposited on the surface of the first photoimageable film between the first photoimageable film and the second photoimageable film. The second photoimageable film is then selectively exposed in a pattern identical to that exposed on the first photoimageable film so that unexposed portions of the second photoimageable film directly overlay the revealed substrate surface formed by removing the unexposed portion of the first photoimageable film. The unexposed portions of the second photoimageable film are removed, thereby revealing the seeded substrate surface underlying the unexposed portion of the second photoimageable film. The revealed, seeded portion of the substrate surface is then plated with an electrically conductive material, after which the exposed portion of the first and second photoimageable films are stripped from the surface of the substrate.

Other features of the above method for preparing a substrate surface for conformal plating, in accordance with the present invention, include vacuum laminating the first photoimageable film, having a thickness of about 0.6 mil, at 100° C. Other features include vacuum laminating the second photoimageable film, having a thickness of about 0.6 mil, at 100° C. Other features include the catalyst selected to promote the formation of an electrically conductive circuit feature on the substrate comprising a palladium seeder, and the step of plating the seeded portion of the substrate including plating the seeded substrate surface with copper.

In accordance with another aspect of the method for preparing a substrate surface for conformal plating, a substrate is provided having a surface adapted for formation of electrical circuit features thereon, and a first photoimageable film is laminated onto the substrate surface. An aqueous photoimageable film is laminated onto the first photoimageable film, and both the aqueous photoimageable film and the first photoimageable film are simultaneously exposed to a source of light whereby unexposed portions of the aqueous film and the first photoimageable film are disposed in a pattern defining predetermined electrical circuit features. The unexposed portions of the aqueous photoimageable film and the first photoimageable film are removed, thereby revealing the substrate surface underlying the unexposed portions of the aqueous photoimageable film and the first photoimageable film. The surface of the revealed portion of the substrate, and the exposed portions of the aqueous photoimageable film are seeded with a catalytic material selected to promote the formation of an electrically conductive metallic material on the seeded surface. The seeded exposed portions of the aqueous photoimageable film are removed, and the seeded revealed surface portion of the substrate are plated with an electrically conductive metallic material.

BRIEF DESCRIPTION OF THE DRAWING

The sole drawing figure is a flow diagram of the method for preparing a substrate surface for conformal plating, in accordance with the present invention.

DETAILED DESCRIPTION OF THE PRESENTLY PREFERRED EXEMPLARY EMBODIMENTS

The present invention prevents bridging between electronic circuit features that are conformally plated, by preventing catalytic seeder material from being deposited on the substrate surface between defined circuit features formed by a fully additive process. Thus, removal of the seeder, prior to conformal plating, is not required. In the first preferred embodiment, a substrate, such as a printed circuit board (PCB), a printed wiring board (PWB), or other thermoset or thermoplastic dielectric structures adapted for the formation of an electrical circuit thereon by the fully additive process, is initially provided, as indicated at block 10 in the drawing figure. As indicated at block 12, a first photoimageable film, also commonly referred to as a photoresist and used interchangeably herein and in the drawing, is vacuum laminated at 100° C. to the surface of the substrate. The photoresist, or photoimageable film, is a light-sensitive film that is applied to a substrate or board, exposed, and developed prior to chemical etching. The exposed areas serve as a mask for selective etching. A suitable photoresist film is manufactured by DuPont under the name Riston T168C. Preferably, the first photoresist film has a thickness of from about 0.6 mil to about 1.0 mil. As will be explained later, in the first preferred embodiment the first photoresist film desirably has a thickness of about 0.6 mil, whereas in the subsequently described second preferred embodiment the first photoresist film desirably has a thickness of about 1.0 mil.

After lamination onto the substrate, selected portions of the first photoimageable film are exposed to light, typically provided by a laser, wherein the unexposed portions of the film are disposed in a pattern which defines the predetermined electrical circuit features desired to be subsequently formed on the substrate surface. This step in the process is represented by block 14. Unexposed portions of the first photoimageable film are removed by developing with propylene carbonate, which reveals the substrate surface underlying the unexposed portions of the first photoimageable film, as indicated at block 16.

The revealed surface of the substrate and the surface of the exposed portions of the first photoimageable film are seeded with a catalyst selected to promote the formation of electrically conductive circuit features on the substrate. Preferably, the seeder is a palladium seeder, such as a colloidal solution of palladium chloride. This seeder advantageously promotes the formation of copper on a surface containing the seed. This step in the process is represented by block 18 in the drawing.

A second photoimageable film, or photoresist, is vacuum laminated onto the seeded revealed substrate and the seeded exposed portions of the first photoimageable film, as indicated at block 20. Preferably, the second photoimageable film has a thickness of about 0.6 mil and the vacuum lamination is carried out at a temperature of about 100° C. This step in the process encapsulates the seed on the surface of the first photoimageable film between the first photoimageable film and the second photoimageable film.

Selected portions of the second photoimageable film are then exposed to light, as indicated at block 22, in a manner whereby unexposed portions of the second photoimageable film directly overlay the revealed substrate surface formed by removing the unexposed portions of the first photoimageable film. Desirably, the second exposed pattern is accurately aligned with the first pattern by optical registration techniques to assure complete conformity of the two patterns.

The unexposed portion of the second photoimageable film is then removed, as indicated at block 24, in the manner described above with removal of the unexposed portions of the first photoimageable film. This step in the process also reveals the substrate surface underlying the unexposed portions of the second photoimageable film which, due to the identical registration of the exposed patterns, reveals the previously seeded surface of the substrate. The developed unexposed areas form channels and other shaped areas which contain the seed necessary to initiate copper plating. Advantageously, the extrenuous seed is encapsulated between the two layers of photoimageable film and is not available to promote plating.

The substrate is then plated with a conductive metal material, such as copper, as indicated at block 26. Preferably, the copper plating is deposited by an electroless process which is continued until the copper surface features have a height of about 1.2 mils, which advantageously is the combined thickness of the first and second photoresist films. After plating, any undesired nodules are sanded off, and the. photoimageable material stripped from the surface of the substrate, as indicated at block 28. Stripping of the remaining exposed portions of the first and second photoresist films may be conveniently carried out using propylene carbonate. Stripping also removes the encapsulated seed between the first and second photoimageable film layers so that the substrate is ready for precious metal conformal plating with no seed material deposits between the narrow copper lines to cause bridging.

In a second preferred embodiment of the present invention, a method for preparing a substrate surface for conformal plating includes providing a suitable substrate, as described above and represented in the drawing by block 10, and vacuum laminating a first photoimageable film having a thickness of from about 0.6 mil to about 1.0 mil, and preferably about 1.0 mil, on the substrate as indicated at block 12. In the second preferred embodiment, an aqueous photoimageable film having a thickness of from about 0.6 to about 1.0 mil is vacuum laminated onto the surface of the first photoimageable film as indicated at block 30. The first photoimageable film has a solvent soluble base, whereas the aqueous photoimageable film employed as the second film layer in the second embodiment has a water soluble base.

The aqueous photoimageable film and the first photoimageable film are simultaneously exposed to light wherein only selected portions are exposed which are arranged in a pattern defining a predetermined electrical circuit feature. This step is indicated at block 32 in the drawing. Importantly, the optical density, i.e., film speed, of the first and second photoresist films are matched so that both films may be exposed simultaneously with a single light source.

The unexposed portions of the aqueous photoimageable film and the first photoimageable film are then removed, as indicated at block 34, by developing the aqueous photoimageable film in a suitable aqueous photoresist developer such as sodium carbonate, and subsequently developing the first photoimageable film with a suitable developer, such as propylene carbonate. This step reveals the surface of the substrate underlying the unexposed portions of the two films.

The surface of the revealed surface of the substrate is then seeded as indicated at block 36. The seeding is carried out as described above, preferably using a palladium seeder such as a colloidal solution of palladium chloride. As can be seen, the seeding occurs not only on the revealed portion of the substrate, but also over the surface of the aqueous photoresist film.

The extraneous seed is removed by simply removing the exposed portions of the aqueous photoresist film on which it is deposited. This step is indicated at block 38 in the drawing, and is carried out by use of sodium hydroxide to strip the aqueous photoresist film. The use of sodium hydroxide as the stripping agent also advantageously accelerates the palladium seeder, thereby enhancing the initial formation of copper on the desired portions of the substrate.

The seeded, revealed surface of the substrate is then plated, as indicated at block 40 with an electrically conductive material, preferably copper, in the manner described above. Advantageously, the 1.0 mil thickness of the remaining exposed first photoresist film provides channels which define side walls for the copper features.

After deposition of the copper plating on the substrate whereby the conductive features of the electrical circuits are defined, the exposed first photoresist film is desirably stripped from the substrate, as represented at block 42, by an organic solvent such as propylene carbonate. Stripping of the first photoresist resist film exposes the side walls of the plated copper features so that conformal plating can be subsequently carried out and all exposed copper surfaces coated with a protective layer of gold or other precious metal. It is not necessary to remove extraneous seeder from the substrate prior to conformal plating, because undesired palladium seed deposits were removed during stripping of the aqueous photoresist film. Thus, the plated substrate is ready for conformal precious metal plating.

Although the present invention is described in terms of a preferred exemplary embodiment, those skilled in the art will recognize that changes in the illustrative photoresist films, respective developers and strippers, may be made without departing from the spirit of the invention. Such changes are intended to fall within the scope of the following claims. Other aspects, features, and advantageous of the present invention may be obtained from a study of this disclosure and the drawings, along with the appended claims.

What is claimed is:

1. A method for conformal plating, of a substrate comprising;

providing a substrate having a surface adapted for formation of electrical circuit features thereon;

applying a first photoimageable film on said substrate surface having a first base composition soluble in a first reagent;

applying a second photoimageable film on said first photoimageable film having a second base composition soluble in a second reagent and which will not dissolve the first base composition;

simultaneously exposing selected portions of said first and second photoimageable films to light to provide an image in the desired electrical circuit pattern, whereby the patterned portions of said first and second photoimageable films are disposed in a common pattern defining predetermined electrical circuit features;

removing said patterned portions of said first and second photoimageable films thereby revealing the substrate surface underlying said patterned portions of the first and second photoimageable films;

seeding the surface of said revealed portions of the substrate and the surface of said second photoimageable film with a catalyst selected to promote the formation of an electrically conductive material on said substrate; and removing remaining portions of the second photoimageable film;

plating said seeded revealed surface of said substrate with an electrically conductive material.

2. The method of claim 1 wherein one of said photoimageable films is an aqueous photoimageable film.

3. The method as defined in claim 2 or in said aqueous photoimageable film is said photoimageable film.

4. A method for conformal plating, as set forth in claim 2, wherein removing said unexposed portions of said aqueous photoimageable film and said first photoimageable include developing said aqueous photoimageable film in sodium carbonate and subsequently developing said first photoimageable film in propylene carbonate.

5. A method for conformal plating, as set forth in claim 2, wherein removing said seeded portion of the aqueous photoimageable film includes stripping said aqueous photoimageable film from said substrate with sodium hydroxide.

6. The method as defined in claim 1 are in said first and second photoimageable films are provided by lamination.

7. A method for conformal plating, as set forth in claim 6, wherein laminating a first photoimageable film on said substrate includes vacuum laminating a photoimageable film having a thickness of about 1.0 mil at 100° C.

8. The method of claim 1 wherein the remaining portion of the first photoimageable film is stripped from the substrate after the plating step.

9. A method for conformal plating, as set forth in claim 2, wherein stripping the exposed portion of the first photoimageable film from said substrate, includes stripping said exposed portion of the first photoimageable film with propylene carbonate.

10. A method for conformal plating, as set forth in claim 1, wherein seeding the surface of said revealed portions of the substrate and the exposed portions of said second photoimageable film include seeding said surfaces with a palladium seeder.

11. A method for conformal plating, as set forth in claim 1, wherein plating said seeded revealed surface portion of the substrate includes plating said seeded substrate surface with copper.

\* \* \* \* \*

UNITED STATES PATENT AND TRADEMARK OFFICE
CERTIFICATE OF CORRECTION

PATENT NO. : 5,905,018            Page 1 of 2
DATED       : May 18, 1999
INVENTOR(S) : Anilkumar Chinuprasad Bhatt, et al It is certified that error appears in the above-identified patent and that said Letters Patent is hereby corrected as shown below:

Claim 1, column 5, line 63, after "reagent" insert --for development--;
       column 6, line 3, after "reagent" insert --for development--;

Claim 3, line 27, after "2" delete "or in" and insert --wherein--;
       same line, after "said" delete "aqueous" and insert --second--;
       line 28, after "said" insert --aqueous--.

Claim 4, line 29, after "claim" change "2" to --3--;
       line 31, after "photoimageable" insert --film--;

Claim 5, line 35, after "claim" change "2" to --3--;

Claim 6, line 39, after "1" delete "are in" and insert --wherein--;

Claim 8, line 45, after "the", second occurrence, delete "remaining"
       line 46, after "film" insert --remaining after the plating step--;
       line 47, after "strate" delete "after the plating step";

Claim 9, line 48, after "claim" delete "2" and insert --8--;

Claim 10, line 55, after "the", second occurrence, delete "exposed portions" and insert --surface--;

UNITED STATES PATENT AND TRADEMARK OFFICE
CERTIFICATE OF CORRECTION

PATENT NO. : 5,905,018
DATED : May 18, 1999
INVENTOR(S) : Anilkumar Chinuprasad Bhatt, et al It is certified that error appears in the above-identified patent and that said Letters Patent is hereby corrected as shown below:

Claim 11, line 59, after "seeded" delete "revealed";
        same line, after "surface" insert --of the revealed--;

Signed and Sealed this

Seventh Day of December, 1999

Q. TODD DICKINSON

*Attest:*

*Attesting Officer*     Acting Commissioner of Patents and Trademarks